United States Patent
Miyamoto et al.

(10) Patent No.: US 8,159,886 B2
(45) Date of Patent: Apr. 17, 2012

(54) MEMORY DEVICE, CONTROL METHOD FOR THE SAME, CONTROL PROGRAM FOR THE SAME, MEMORY CARD, CIRCUIT BOARD AND ELECTRONIC EQUIPMENT

(75) Inventors: Toshihiro Miyamoto, Kawasaki (JP); Akio Takigami, Kawasaki (JP); Masaya Inoko, Kawasaki (JP); Takayoshi Suzuki, Kawasaki (JP); Hiroyuki Ono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/242,027

(22) Filed: Sep. 30, 2008

(65) Prior Publication Data
US 2009/0021991 A1   Jan. 22, 2009

Related U.S. Application Data

(63) Continuation of application No. PCT/JP2006/306892, filed on Mar. 31, 2006.

(51) Int. Cl.
G11C 7/00 (2006.01)
G11C 7/22 (2006.01)
G11C 7/10 (2006.01)
G06F 13/00 (2006.01)
G06F 13/28 (2006.01)

(52) U.S. Cl. .............. 365/189.14; 711/156; 365/185.08; 365/189.17

(58) Field of Classification Search .............. 365/185.08, 365/189.17, 189.14, 189.15, 189.16; 711/156
See application file for complete search history.

(56) References Cited

U.S. PATENT DOCUMENTS

| | | | |
|---|---|---|---|
| 5,293,424 A | | 3/1994 | Holtey et al. |
| 5,438,536 A | * | 8/1995 | Salzman ................... 365/52 |
| 5,469,390 A | | 11/1995 | Sasaki et al. |
| 5,603,051 A | | 2/1997 | Ezzet |
| 5,699,302 A | | 12/1997 | Shinozaki et al. |
| 5,732,278 A | | 3/1998 | Furber et al. |
| 5,812,491 A | | 9/1998 | Shinozaki et al. |
| 5,910,917 A | | 6/1999 | Fukuzumi |
| 6,262,937 B1 | | 7/2001 | Arcoleo et al. |
| 6,314,049 B1 | * | 11/2001 | Roohparvar ............... 365/233.1 |
| 6,594,167 B1 | | 7/2003 | Yamasaki et al. |
| 6,691,204 B1 | | 2/2004 | Roohparvar |

(Continued)

FOREIGN PATENT DOCUMENTS

CN  1738102 A  2/2006

(Continued)

OTHER PUBLICATIONS

International Preliminary Report on Patentability and Written Opinion mailed on Oct. 30, 2008 and issued in corresponding International Patent Application No. PCT/JP2006/306892.

(Continued)

*Primary Examiner* — J. H. Hur
(74) *Attorney, Agent, or Firm* — Staas & Halsey LLP

(57) ABSTRACT

A memory device having a single or a plurality of memory chips includes a memory part (control register, SPD memory unit) inside each memory chip, which memory part stores control data concerning the memory chip. The memory device enables writing-in or readout of the control data stored on the memory part to be able to set any desired control data for each memory chip, and, when the memory device has the plurality of memory chips, enables separate use of each of the memory chips.

16 Claims, 10 Drawing Sheets

U.S. PATENT DOCUMENTS

| | | | |
|---|---|---|---|
| 6,744,127 | B2 | 6/2004 | Hedler et al. |
| 6,775,169 | B1 | 8/2004 | d'Acoz et al. |
| 6,785,764 | B1 * | 8/2004 | Roohparvar .................. 711/103 |
| 7,099,221 | B2 | 8/2006 | Klein |
| 7,181,241 | B2 | 2/2007 | Fukuda |
| 7,438,599 | B2 | 10/2008 | Uchida et al. |
| 2001/0052090 | A1 | 12/2001 | Mio |
| 2002/0023191 | A1 | 2/2002 | Fudeyasu |
| 2002/0178338 | A1 | 11/2002 | Shibuya et al. |
| 2003/0016574 | A1 | 1/2003 | Hachiya |
| 2003/0065996 | A1 | 4/2003 | Shimada et al. |
| 2004/0054864 | A1 | 3/2004 | Jameson |
| 2005/0007835 | A1 | 1/2005 | Lee et al. |
| 2005/0086572 | A1 | 4/2005 | Hirabayashi |
| 2005/0172059 | A1 | 8/2005 | Yoshimura et al. |
| 2006/0038012 | A1 | 2/2006 | Uchida et al. |
| 2007/0277016 | A1 | 11/2007 | Risse |

FOREIGN PATENT DOCUMENTS

| | | |
|---|---|---|
| JP | 57-075361 | 5/1982 |
| JP | 04-248641 | 9/1992 |
| JP | 04-325993 | 11/1992 |
| JP | 06-208515 | 7/1994 |
| JP | 7-64869 | 3/1995 |
| JP | 07-064869 | 3/1995 |
| JP | 07-169271 | 7/1995 |
| JP | 08-124380 | 5/1996 |
| JP | 09-006722 | 1/1997 |
| JP | 09-507325 | 7/1997 |
| JP | 09-259582 | 10/1997 |
| JP | 11-73368 | 3/1999 |
| JP | 11-328975 | 11/1999 |
| JP | 2000-194598 | 7/2000 |
| JP | 2001-351398 | 12/2001 |
| JP | 2002-063791 | 2/2002 |
| JP | 2003-023349 | 1/2003 |
| JP | 2003-36697 | 2/2003 |
| JP | 2004-110785 | 4/2004 |
| JP | 2005-78431 | 3/2005 |
| JP | 2005-182263 | 7/2005 |
| JP | 2005-196486 | 7/2005 |
| JP | 2005-322251 | 11/2005 |
| KR | 2002-0089131 | 11/2002 |

OTHER PUBLICATIONS

European Search Report issued Apr. 21, 2009 in corresponding European Patent Application 06730840.3.

Norihiko Naono, et al., "Details of Design Method for High-speed Digital System-Design for ASIC/printed Circuit Board and System debug," Nikkei Business Publications Inc., Oct. 15, 2001, pp. 312-324.

U.S. Office Action mailed Sep. 29, 2009 in corresponding U.S. Appl. No. 12/241,955.

European Office Action dated Aug. 11, 2009 and issued in corresponding European Patent Application 06 730 840.3.

European Office Action dated Aug. 11, 2009 and issued in corresponding European Patent Application 06 730 837.9.

Chinese Office Action issued Dec. 14, 2010 in corresponding Chinese Patent Application 200680053925.6.

U.S. Office Action mailed Dec. 22, 2010 in related U.S. Appl. No. 12/241,955.

International Search Report and Written Opinion mailed May 2, 2006 in corresponding International Patent Application PCT/JP2006/306892.

Korean Office Action issued Jan. 26, 2010 in corresponding Korean Patent Application 10-2008-7022868.

Korean Office Action issued Jan. 26, 2010 in corresponding Korean Patent Application 10-2008-7022792.

Korean Office Action issued Jan. 30, 2010 in corresponding Korean Patent Application 10-2008-7023168.

European Search Report issued in corresponding European Patent Application 06730837.9.

European Office Action dated Mar. 29, 2010 and issued in corresponding European Patent Application 06 730 837.9.

European Office Action dated Mar. 29, 2010 and issued in corresponding European Patent Application 06 730.840.3.

Chinese Office Action dated Mar. 30, 2010 and issued in corresponding Chinese Patent Application 200680053925.6.

U.S. Office Action mailed May 7, 2010 in related U.S. Appl. No. 12/241,955.

Chinese Office Action dated May 12, 2010 and issued in corresponding Chinese Patent Application 200680053831.9.

Japanese Office Action issued May 31, 2011 in corresponding Japanese Patent Application 2008-509638.

U.S. Office Action mailed Jul. 27, 2011 in related U.S. Appl. No. 12/241,955.

Partial English Translation of Norhiko Nano et al, "Details of Design Method for High-Speed Digital System Design for ASIC/printed Circuit Board and System debug", Nikkei Business Publications Inc., Oct. 15, 2001.

Japanese Office Action issued Aug. 9, 2011 in corresponding Japanese Patent Application 2008-509634.

Japanese Office Action issued Aug. 9, 2011 in corresponding Japanese Patent Application 2008-509637.

Japanese Office Action issued Sep. 20. 2011 in corresponding Japanese Patent Application 2008-509638.

U.S. Office Action mailed Sep. 15, 2011 in related U.S. Appl. No. 12/242,081.

Japanese Office Action issued Aug. 9, 2011 in corresponding Japanese Patent Application 2008-509638.

* cited by examiner

MEMORY DEVICE, CONTROL METHOD FOR THE SAME, CONTROL PROGRAM FOR THE SAME, MEMORY CARD, CIRCUIT BOARD AND ELECTRONIC EQUIPMENT

CROSS-REFERENCE TO RELATED APPLICATIONS

This application is a continuation of International Application No. PCT/JP2006/306892, filed on Mar. 31, 2006, now pending, herein incorporated by reference.

BACKGROUND OF THE INVENTION

1. Field of the Invention

The present invention relates to a memory that is used for data storage in an electronic apparatus such as a personal computer (PC), and, more particularly, to a memory device having an interface function, a control method for the memory device, a control program for the memory device, a memory card, a circuit board and electronic equipment.

2. Description of the Related Art

A PC is provided with such JEDEC (Joint Electron Device Engineering Council) standard memories as a SDRAM (Synchronous Dynamic Random Access Memory) and DDR-SDRAM (Double Data Rate-SDRAM).

With respect to such a memory, Japanese Patent Application Laid-Open Publication No. 2004-110785 (ABSTRACT, FIG. 1, etc.) discloses a memory controller that includes a plurality of programmable timing registers that can be programmed to store timing data fit to a memory device. Japanese Patent Application Laid-Open Publication No. (H)06-208515 (ABSTRACT, FIG. 1, etc.) discloses a memory card that incorporates therein a microprocessor chip and a nonvolatile memory chip that are connected to each other via an internal card bus, the microprocessor chip containing key data, usage data and program command data. Japanese Patent Application Laid-Open Publication No. (H)09-6722 (ABSTRACT, FIG. 2, etc.) discloses a computer system having an input/output processor provided as a built-in processor connected to a local memory. Japanese Patent Application Laid-Open Publication No. 2005-196486 (paragraph 0029, FIG. 6, etc.) discloses a memory having an SPI driver and a memory means that are arranged inside the memory. Published Japanese Translations of PCT International Publication for Patent Applications No. (H)09-507325 (ABSTRACT, FIG. 1, etc.) discloses a data processing system including a CPU that is linked to a data memory via a single-direction readout bus, a single-direction writing-in bus and an address bus. Japanese Patent Application Laid-Open Publication No. 2002-63791 (ABSTRACT, FIG. 1, etc.) discloses a memory system in which a memory controller is connected to a memory via a writing-in data transfer bus and a readout data transfer bus that are separately disposed. Japanese Patent Application Laid-Open Publication No. (H)11-328975 (ABSTRACT, FIG. 2, etc.) discloses a random-access memory configured in such a way that data transfer to random-access memories is controlled in response to first translation of a period signal and data transfer from an array of random-access memories is controlled in response to second translation of the period signal. Japanese Patent Application Laid-Open Publication No. (H)07-169271 (paragraph 0038, FIG. 1, etc.) discloses a semiconductor memory device that includes a DRAM, and a CDRAM having a DRAM control and cache/refresh control unit. Japanese Patent Application Laid-Open Publication No. (H)08-124380 (paragraph 0020, FIG. 2, etc.) discloses a synchronous DRAM that has a memory array and a control unit and that allows setting of a mode register only when the data contents of a data bus is equal to operation status check data. Japanese Patent Application Laid-Open Publication No. (H)09-259582 (paragraph 0028, FIG. 1, etc.) discloses a mode register control circuit provided as an SDRAM and so on.

As shown in FIG. 1, a conventional memory module 2 includes a circuit board that carries a plurality of memory chips 41, 42, . . . and 4N and an SPD (Serial Presence Detect) memory unit 6. The memory chips 41, 42, . . . and 4N are connected to a memory access bus 8, and the SPD memory unit 6 is connected to an SPD access bus 10. In this memory module 2, the specifications and functions of the memory chips 41, 42, . . . and 4N, such as types and timing parameters of the memory chips, are stored on the SPD memory unit 6. As a result, consistency of the memory module 2 with a setting environment depends on control data stored on the SPD memory unit 6. The SPD memory unit 6 stores memory-related control data, which includes memory-related various parameters such as CAS (Column Array Strobe) latency, burst length, and additive latency. These control data are the data for setting different values depending on a chip set and a CPU (Central Processing Unit) that control memories. The SPD memory unit 6 is comprised of such a nonvolatile memory as EEPROM (Electrically Erasable Programmable Read-only Memory) Keeping control parameters necessary for memories in a component separated from the memories requires handling and control corresponding to the separate parameter storage, leading to an increase in various costs including product cost and writing-in cost.

Although the memory module 2 has a number of memory chips 41, 42, . . . and 4N, the specification of each of the memory chips 41, 42, . . . and 4N is regulated by the SPD memory unit 6. This makes impossible separate use of each of the memory chips 41, 42, . . . and 4N as a memory chip having a different specification. In other words, such a memory module 2 lacks flexibility in practical use.

The above patent documents suggest or disclose nothing about the above problems, and disclose nothing about a solution to the problems, either.

SUMMARY OF THE INVENTION

An object of the present invention is to improve flexibility of a memory device having a plurality of memory chips to enable the memory device to give each of the memory chips separate control data.

Another object of the present invention is to separately control each of memory chips to optimize a memory and improve its compatibility.

To achieve the above objects, a memory device of the present invention having a single or a plurality of memory chips includes a memory unit inside each memory chip, which memory part stores control data on the memory chip. The memory device enables writing-in or readout of the control data stored on the memory part to be able to set any desired control data for each memory chip, and, when the memory device has the plurality of memory chips, enables separate use of each of the memory chips.

To achieve the above objects, a first aspect of the present invention provides a memory device including a single or a plurality of memory chips, comprising each memory chip that has a memory part, which stores control data concerning the memory chip, inside thereof, wherein the control data stored in the memory part is allowed to be written in and read out. In such a configuration, the memory chips are memory component units making up the memory device provided as a memory module and so on. Each memory chip includes a single or a plurality of memory matrixes. In this configuration, control data on the memory chip is stored on the control memory part, and the control data stored on the memory part is rewritable. Hence the above objects are achieved.

To achieve the above objects, in the above memory device, preferably the memory part should not be provided as an independent EEPROM or mask ROM but may be provided as a control register. Such a configuration also achieves the above objects.

To achieve the above objects, in the above memory device, preferably the memory chip may have a single or a plurality of memory matrixes. Such a configuration also achieves the above objects.

To achieve the above objects, in the above memory device, preferably the memory chip may have a fixed data memory part inside thereof, the fixed data memory part storing fixed data out of the control data concerning the memory chip. Such a configuration also achieves the above objects.

To achieve the above objects, in the above memory device, preferably the fixed data stored in the fixed data memory part may be allowed to be transferred to the memory part inside the memory chip. Such a configuration also achieves the above objects.

To achieve the above objects, a second aspect of the present invention provides a control method for a memory device including a single or a plurality of memory chips, the method comprising a step of writing in or reading out control data concerning each memory chip to or from a memory part storing the control data. According to such a configuration, a memory chip is identified by using address data on the memory chip, and rewriting control data stored on the memory part of the identified memory chip allows the memory chip to operate in correspondence to a change in a service environment and so on. This improves compatibility of the memory device and optimizes the memory device.

To achieve the above objects, a third aspect of the present invention provides a control program for a memory device executed by a computer, the control program driving the computer to execute a step of writing in or reading out control data to or from a memory part of a memory chip. According to such a configuration, the control program is executed by a computer apparatus at electronic equipment, such as a computer equipped with the memory device. In execution of the control program, a memory chip is identified by using address data on the memory chip. The computer apparatus rewrites control data stored on the memory part of the identified memory chip to allow the memory chip to deal with a change in a service environment and so on. This improves compatibility of the memory device and optimizes the memory device, thus achieves the above objects.

To achieve the above objects, a fourth aspect of the present invention provides a memory card including a single or a plurality of memory chips, comprising each memory chip that has a memory part, which stores control data concerning the memory chip, inside thereof, wherein the control data stored in the memory part is allowed to be written in or read out.

To achieve the above objects, in the memory card, preferably the memory part may be comprised of a control register. Such a configuration also achieves the above objects.

To achieve the above objects, in the memory card, preferably the memory chip may have a single or a plurality of memory matrixes. Such a configuration also achieves the above objects.

To achieve the above objects, in the memory card, preferably the memory chip may have a fixed data memory part inside thereof, the fixed data memory part storing fixed data out of the control data concerning the memory chip. Such a configuration also achieves the above objects.

To achieve the above objects, in the memory card, preferably the fixed data stored on the fixed data memory part may be allowed to be transferred to the memory part. Such a configuration also achieves the above objects.

To achieve the above objects, a fifth aspect of the present invention provides a circuit board provided with a memory device including a single or a plurality of memory chips, comprising each memory chip that has a memory part, which stores control data concerning the memory chip, inside thereof, wherein the control data stored in the memory part is allowed to be written in or read out. Such a configuration also achieves the above objects.

To achieve the above objects, preferably a circuit board may comprise a slot into which the memory card is fitted. Such a configuration also achieves the above objects.

To achieve the above objects, a sixth aspect of the present invention provides electronic equipment using the memory device. This electronic equipment may be provided as any form of equipment such as a computer, as long as it carries out data storage using the memory device. Such a configuration also achieves the above objects.

To achieve the above objects, a seventh aspect of the present invention provides electronic equipment using the memory card. In this case, the electronic equipment may be also provided as any form of equipment such as a computer, as long as it carries out data storage using the memory device. Such a configuration also achieves the above objects.

Features and advantages of the present invention are listed as follows.

(1) A memory part inside each memory chip stores control data concerning the memory chip, and the control data is used on a memory-chip-to-memory-chip basis. This enables the use of each memory chip as a memory chip having a different specification, thus improves flexibility of the memory device.

(2) Each memory chip is controlled separately based on control data stored on the memory chip to optimize the memory device.

(3) Control data stored on the memory part in each memory chip is rewritten to improve compatibility of the memory device.

Other objects, features, and advantages will be further clarified by referring to the accompanying drawings and embodiments.

DETAILED DESCRIPTION OF THE PREFERRED EMBODIMENTS

First Embodiment

Figure 1:
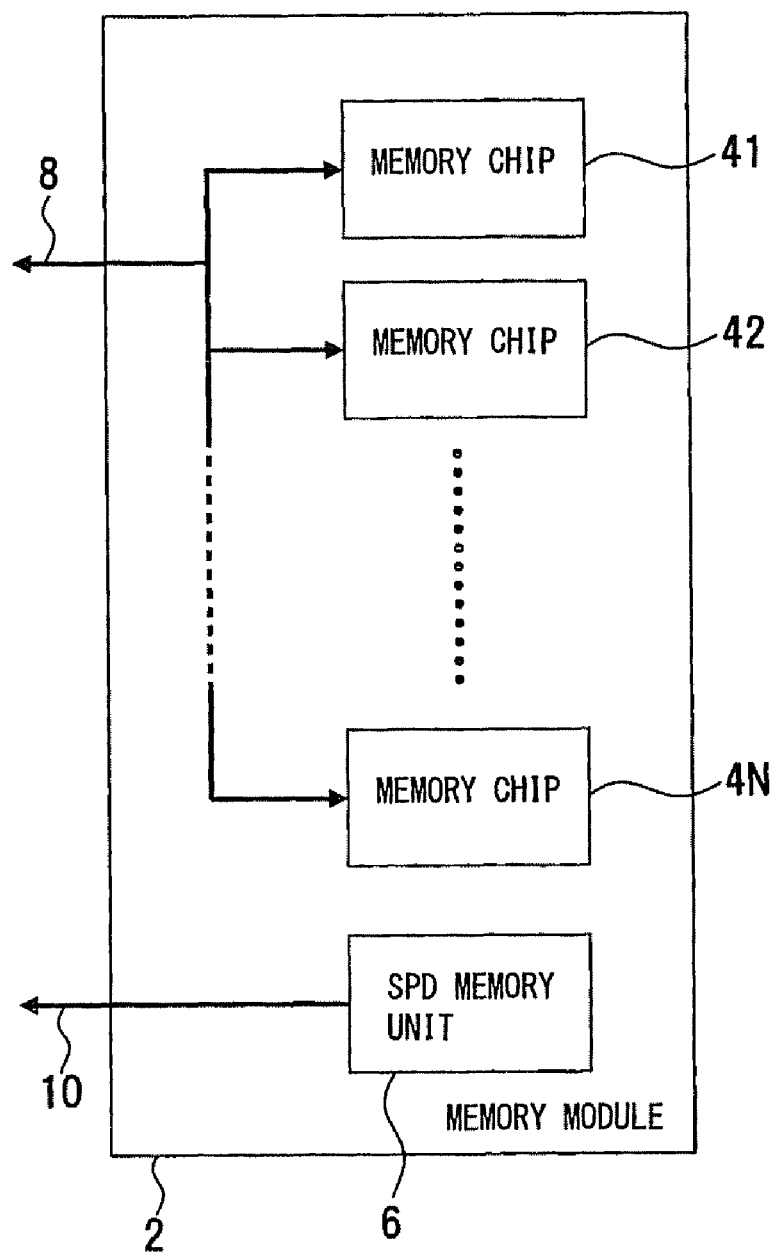
FIG. 1 is a view of a configuration of a conventional memory.
Figure 2:
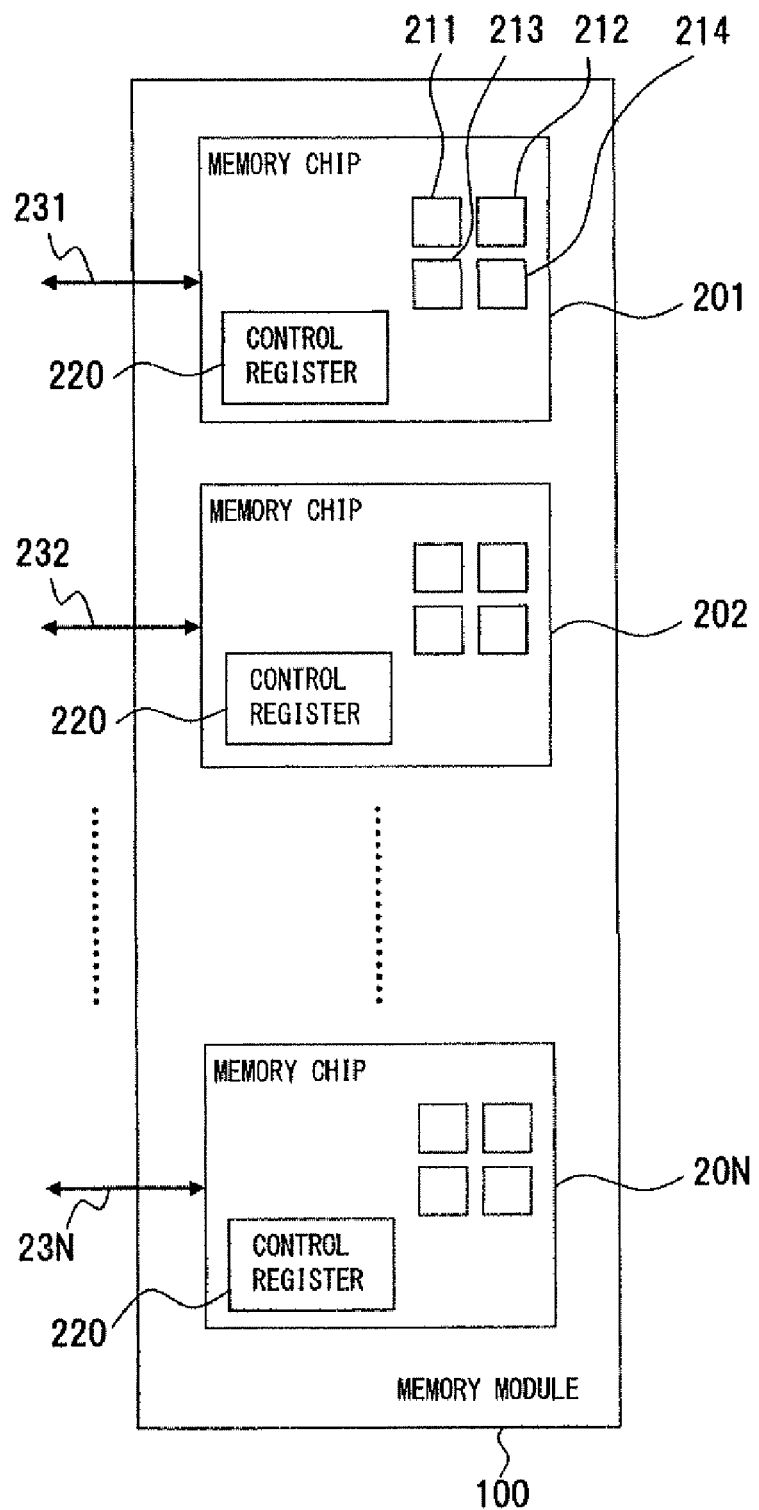
FIG. 2 is a view of an exemplary configuration of a memory module of a first embodiment.

A first embodiment of the present invention will be described with reference to FIG. 2, which depicts an exemplary configuration of a memory module of the first embodiment. FIG. 2 depicts an example of a memory device of the present invention. The configuration of the memory device of the present invention, therefore, is not limited to the configuration shown in FIG. 2.

The memory module 100 is an example of the memory device of the present invention. For example, the memory module 100 includes a circuit board that carries a plurality of memory chips 201, 202, . . . and 20N. The memory chips 201, 202, . . . and 20N are memory component units, and need not to be the minimum component units but may be configured to be different from the memory component units. In this embodiment, the memory module 100 is comprised of the plurality of memory chips 201, 202, . . . and 20N. The memory module 100, however, may be constructed as a single memory module.

Each of the memory chips 201, 202, . . . and 20N has, for example, four memory matrixes 211, 212, 213 and 214 serving as a plurality of banks, and a control register 220 serving as a memory part storing control data. Each control register 220 stores individual control data on each of the memory chips 201, 202, . . . and 20N. This control data includes various memory-related parameters such as CAS (Column Array Strobe) latency, burst length and additive latency. The control data, therefore, may vary for each of the memory chips 201, 202, . . . and 20N, or may be the same for every memory chip.

The memory chips 201, 202, . . . and 20N are connected to buses 231, 232, . . . and 23N, respectively. This enables data reading/writing from/to any one of the memory chips 201 to 20N that is identified by address data, and also enables writing in and rewriting of such control data as specification data and/or function data stored on the control register 220, based on address data identifying any one of the memory chips 201 to 20N.

In such a configuration, although the specifications and functions of the memory chips 201 to 20N mounted on the memory module 100 are regulated by control data stored on the control registers 220 of the memory chips, each of the memory chips 201 to 20N can be used as a memory chip having a different configuration by using storage data stored on each control register 220. In other words, control data stored on the control register 220 functions as identification data or function data that identifies each of the memory chips 201 to 20N or the memory module 100 as a whole.

When control data stored on the control register 220 is allowed to function as identification data on each of the memory chips 201 to 20N, each of the memory chips 201 to 20N is identified by the control data, which enables separate data reading/writing. Despite of being incorporated in the single memory module 100, therefore, each of the memory chips 201 to 20N can be separately used as a memory chip having a different standard, that is, a different specification and function. The memory module 100 thus constitutes the memory device that is highly flexible.

Since each of the memory chips 201 to 20N can be controlled separately based on control data stored on the control register 220, the parameters of each of the memory chips 201 to 20N or of the memory module 100 may be changed for operation corresponding to a given service environment. This optimizes the memory device and improves compatibility of the memory device.

Figure 3:
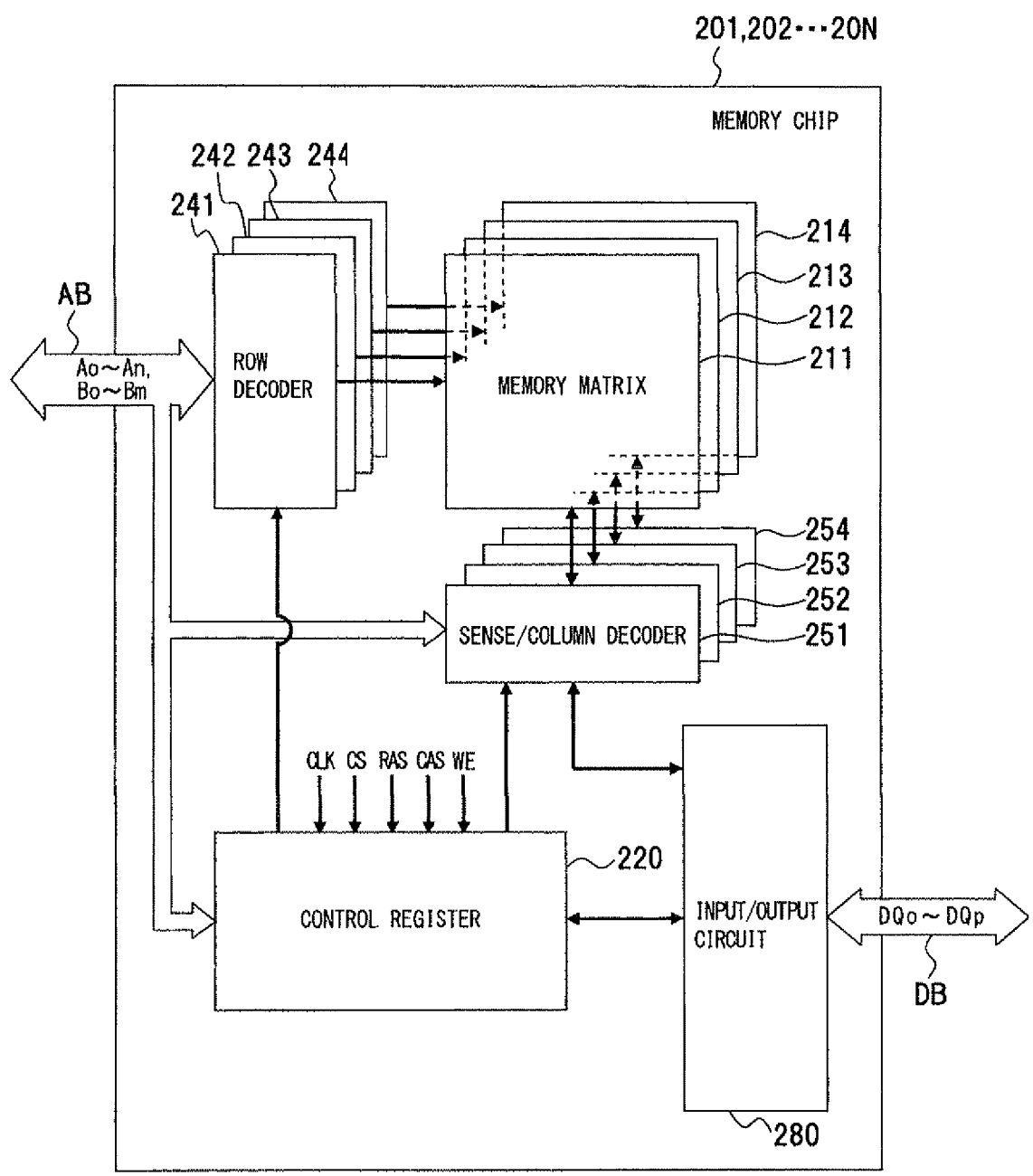
FIG. 3 is a block diagram of an exemplary configuration of a memory chip.

The memory chips 201 to 20N arranged on the memory module 100 will then be described with reference to FIG. 3. FIG. 3 is a block diagram of an exemplary configuration of a memory chip. In FIG. 3, the same components as described in FIG. 2 are denoted by the same reference numerals.

Each of the memory chips 201 to 20N includes a plurality of memory matrixes 211 to 214, row decoders 241, 242, 243 and 244 that correspond to the memory matrixes 211, 212, 213 and 214, respectively, and sense/column decoders 251, 252, 253 and 254 that correspond to the memory matrixes 211, 212, 213, and 214 respectively. Each of the memory matrixes 211 to 214 has a plurality of memory cells arranged in a matrix form, i.e., rows and columns of memory cells. In this case, an N bit address signal passes through an N bit row buffer, and, in response to a row address selection signal RAS, comes into the row decoders 241 to 244, where a row of memory cells are selected. In response to a column address selection signal CAS, the N bit address signal then comes into sense/column decoders 251 to 254, where a column of memory cells are selected, which enables data reading and writing. Each of the memory matrixes 211 to 214 is capable of such an operation.

As described above, the control register 220 stores CAS (Column Address Strobe) latency and so on, as control data, which is read and written based on address data from an address bus AB. Ao to An denote writing-in addresses, and Bo to Bm denote bank addresses.

The control register 220 is connected to an input/output circuit 280, which is connected to a data bus DB, through which control data and so on are exchanged with an external device. DQo to DQp denote data.

Figure 4:
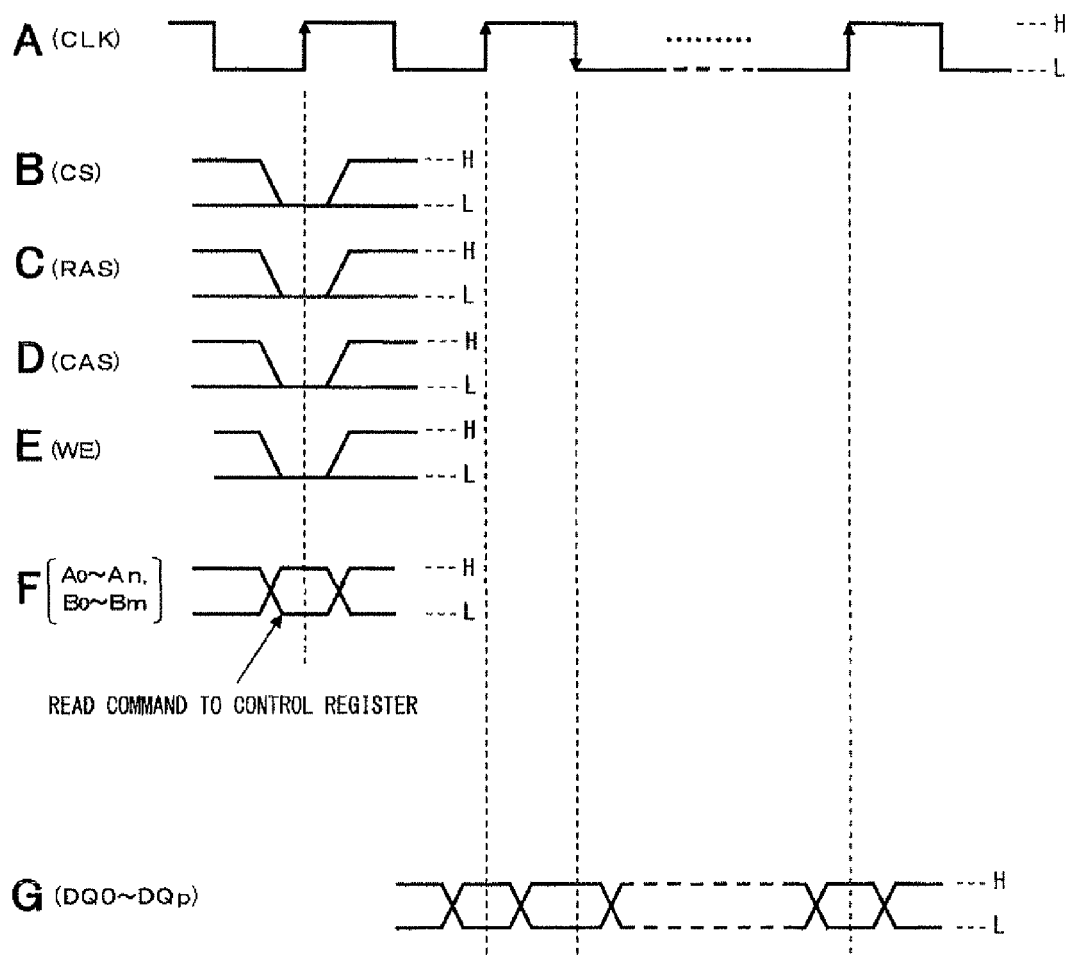
FIG. 4 is timing charts showing input/output control of a control register.

In such a configuration, the control register 220 receives input of a clock signal CLK (denoted by A in FIG. 4), a chip select signal CS (denoted by B in FIG. 4), the row address selection signal RAS (denoted by C in FIG. 4), the column address selection signal CAS (denoted by D in FIG. 4), a write enable signal WE (denoted by E in FIG. 4), and address data Ao to An and Bo to Bm (denoted by F in FIG. 4) as read commands, as shown in FIG. 4. Receiving such read command signals, the control register 220 sends output data DQo to DQp (denoted by G in FIG. 4) through the input/output circuit 280 into the data bus DB.

Second Embodiment

Figure 5:
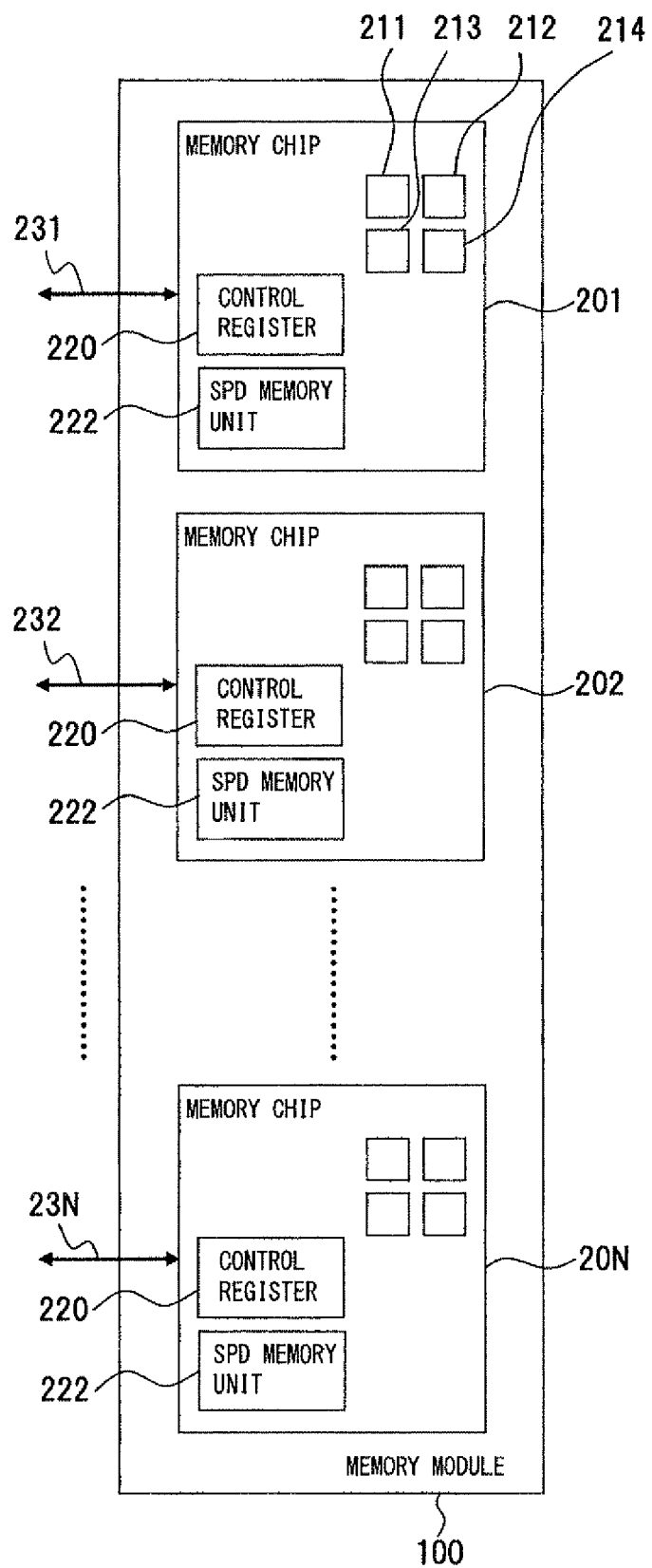
FIG. 5 is a view of an exemplary configuration of a memory module of a second embodiment.
Figure 6:
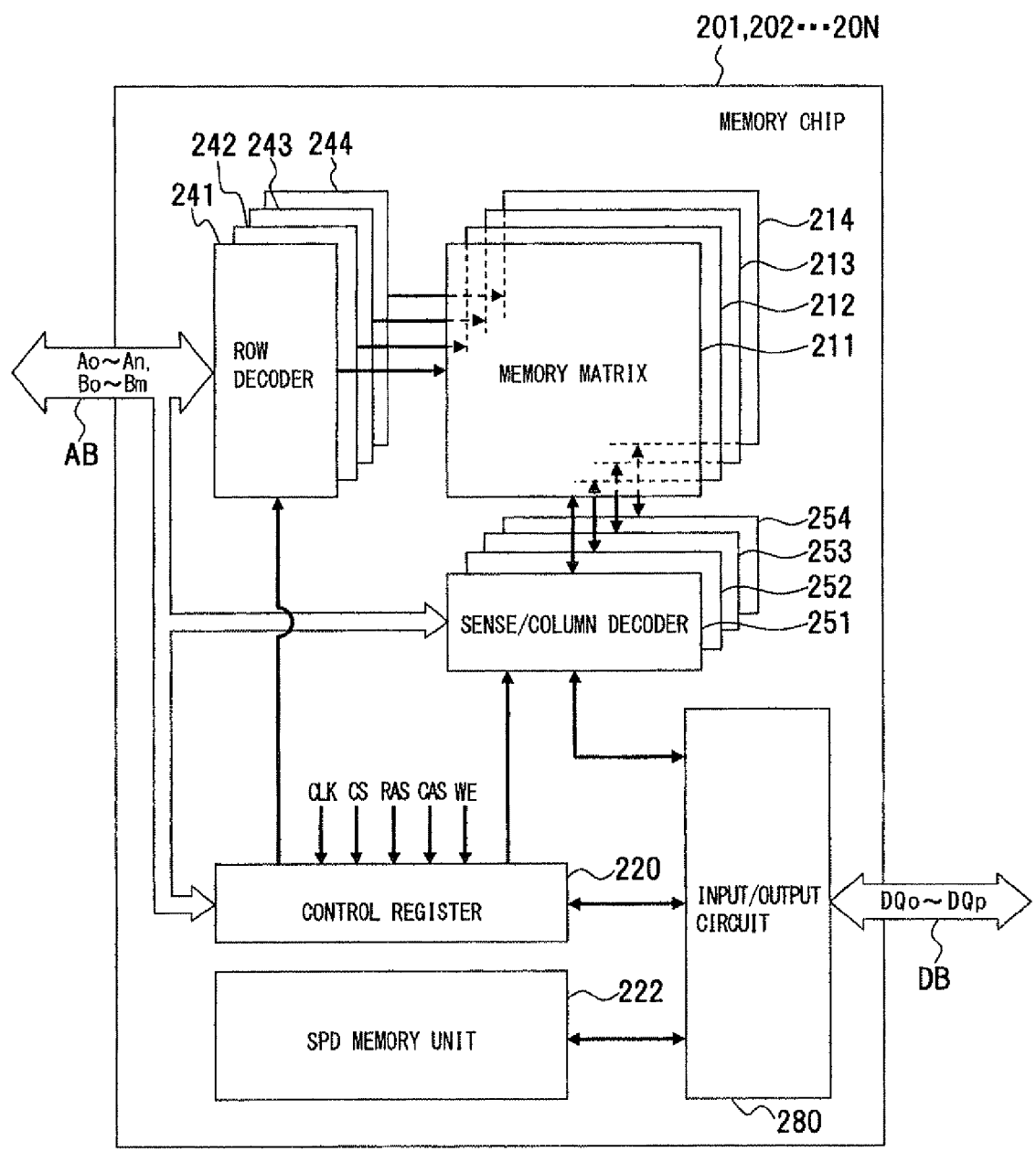
FIG. 6 is a block diagram of an exemplary configuration of a memory chip.

A second embodiment of the present invention will be described with reference to FIGS. 5 and 6. FIG. 5 depicts an exemplary configuration of a memory module of the second embodiment, and FIG. 6 is a block diagram of an exemplary configuration of a memory chip. In FIGS. 5 and 6, the same components as described in FIGS. 2 and 3 are denoted by the same reference numerals. FIGS. 5 and 6 depict an example of a memory device of the present invention. The configuration of the memory device of the present invention, therefore, is not limited to the configuration shown in FIGS. 5 and 6.

In the memory module 100 of the embodiment, as shown in FIG. 5, each of the memory chips 201 to 20N has the control register 220 serving as a fluctuation data memory part and an SPD memory unit 222 serving as a fixed data memory part. The SPD memory unit 222 stores fixed control data, which is, for example, memory-related various parameters such as CAS latency, burst length and additive latency. The control register 220 has stores fixed control data read out from the SPD memory unit 222, which is, for example, such a parameter as CAS latency.

As shown in FIG. 6, in each of the memory chips 201 to 20N, the control register 220 and the SPD memory unit 222 are juxtaposed with each other, and are each connected to the input/output circuit 280, so that fixed control data read out from the SPD memory unit 222 is output through the input/output circuit 280 to the outside, or to the control register 220 on which the fixed control data is stored. This control data stored on the control register 220 determines the functions and operation of the memory matrixes 211 to 214.

Other operation and functions of the memory module 100 of the embodiment are the same as that of the first embodiment, and therefore are omitted in further description.

Third Embodiment

Figure 7:
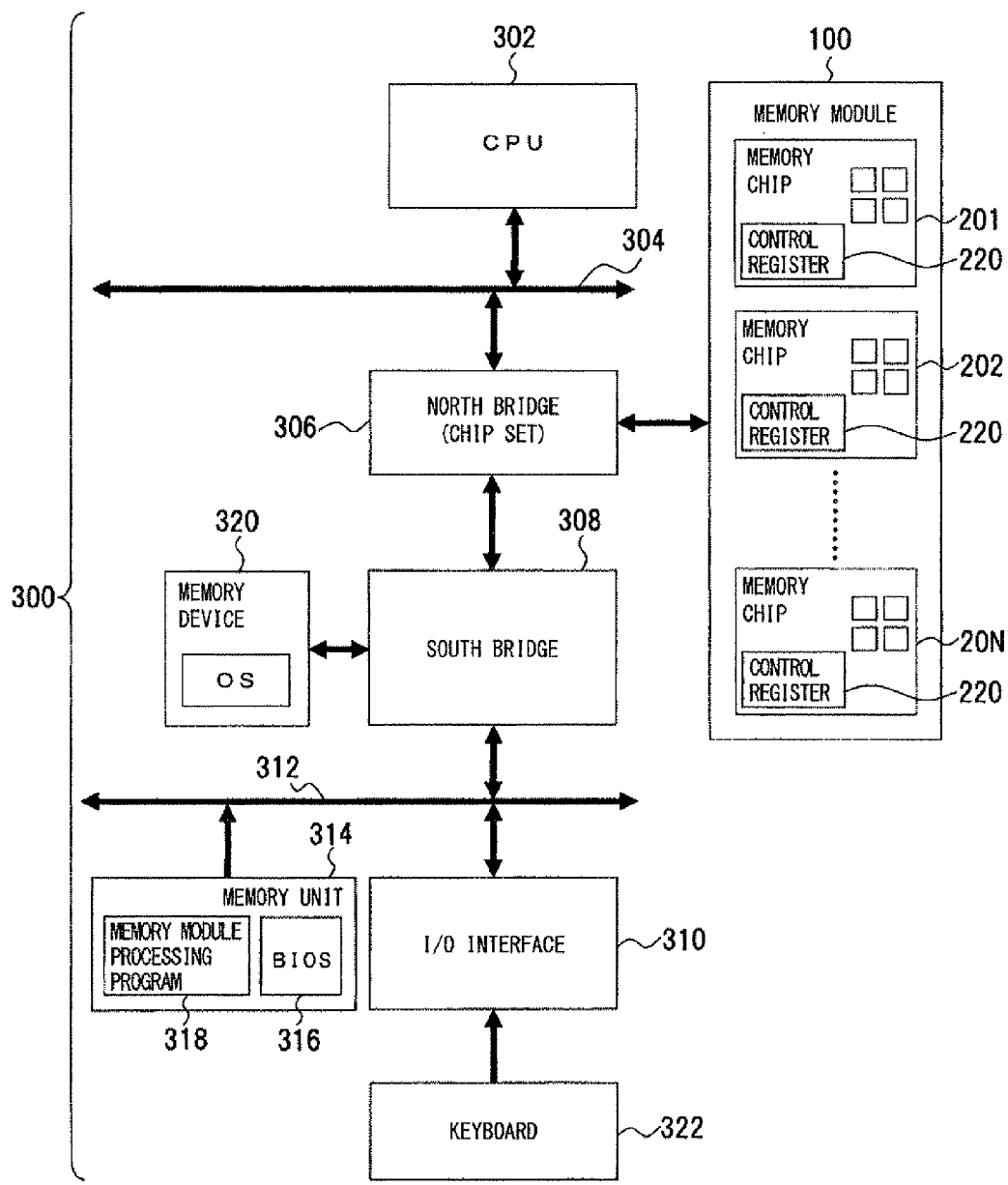
FIG. 7 is a view of an exemplary configuration of a personal computer of a third embodiment.
Figure 8:
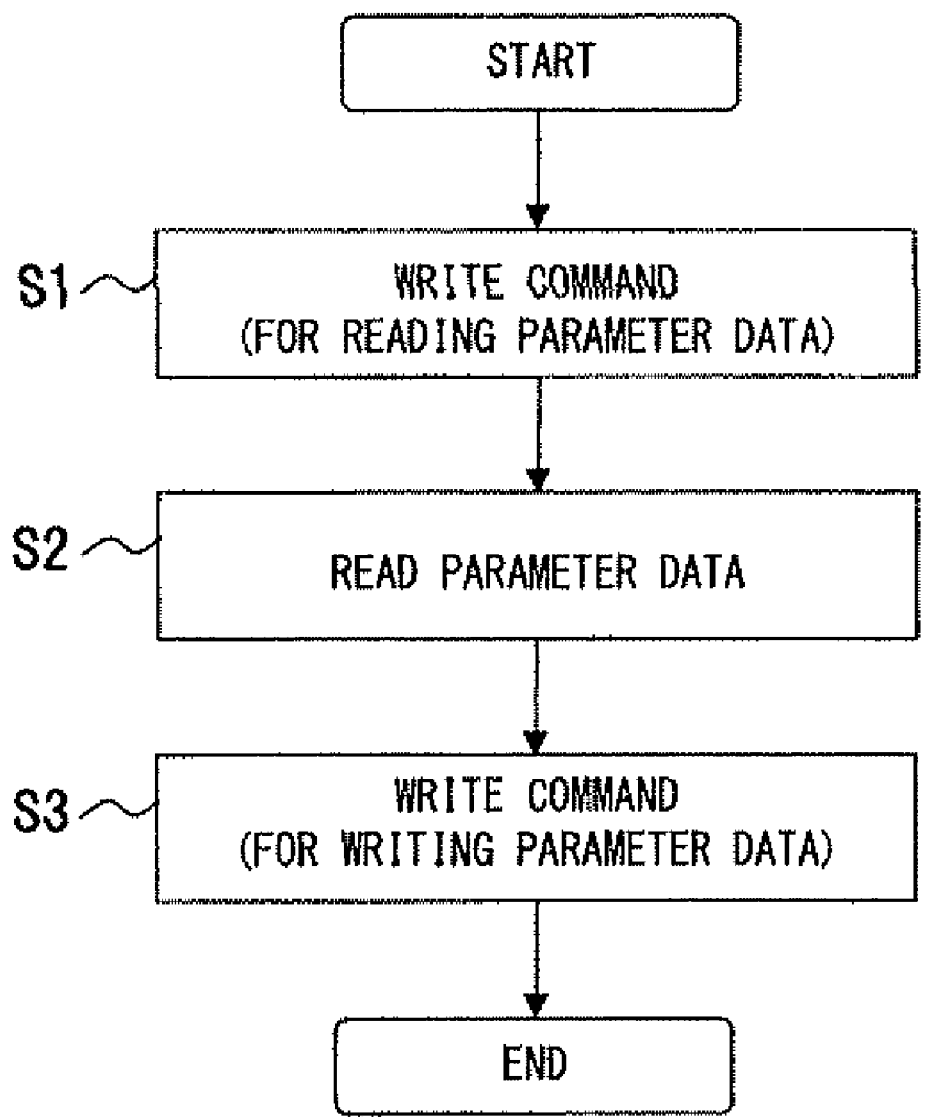
FIG. 8 is a flowchart of a procedure of a process of writing in or rewriting control data.

A third embodiment of the present invention will be described with reference to FIGS. 7 and 8. FIG. 7 depicts an exemplary configuration of a personal computer (PC) of the third embodiment, and FIG. 8 is a flowchart of a procedure of a process of writing in or reading out storage data to and from a memory part. In FIG. 7, the same components as described in FIG. 2 or 5 are denoted by the same reference numerals.

The PC 300 is an example of electronic equipment having the memory module 100, and is capable of reading and writing storage data stored on each of the control register 220 of the memory chips 201 to 20N of the memory module 100, based on address data.

The PC 300 includes a CPU (Central Processing Unit) 302, which is connected to a north bridge (chip set) 306 via a bus 304. The north bridge 306 is connected to the memory module 100, and is also connected to an input/output (I/O) interface 310 via a south bridge 308. The north bridge 306 is a means that carries out data exchange between the CPU 302 and the memory module 100, and the south bridge 308 is a means that carries out data exchange between the CPU 302 and the I/O interface 310.

The memory module 100 has the above configuration (shown in FIGS. 2 and 3 or FIGS. 5 and 6), in which the same components as described above are denoted by the same reference numerals for saving further description.

To a bus 312 interposed between the south bridge 308 and the I/O interface 310, a memory unit 314 composed of a nonvolatile memory and so on is connected. The memory unit 314 stores a BIOS (Basic Input/Output System) 316 and a memory module processing program 318 for writing in or rewriting such control data as specification data and/or function data stored on each control register 220 of the memory module 100. The memory module processing program 318 can be executed by an operation system (OS) that is stored on a memory device 320 composed of such a nonvolatile memory as a hard disc drive (HDD). The I/O interface 310 is connected to input/output devices such as a keyboard 322 and a display device not shown.

Writing in or rewriting of control data in the memory module 100 in the above configuration will be described with reference to FIG. 8. FIG. 8 is a flowchart of a procedure of a process of writing in or rewriting control data.

Ordinary memory access is made to an address on a memory. In reading or writing parameters as control data, access is made to an address for parameter data reading/writing, etc., on a command register in the north bridge 306, which is a memory controller, and to an address on a data register for parameter reading and so on.

In a memory initialization procedure, writing of a command (for reading parameter data) is carried out first (step S1). Subsequently, reading of parameter data is carried out (step S2). Then, writing of a command (for writing parameter data) is carried out (step S3), and the procedure is ended. As a result, control data representing a specification and function is written to the control register 220 of the memory module 100, or control data stored on the control register 220 can be updated.

Fourth Embodiment

Figure 9:
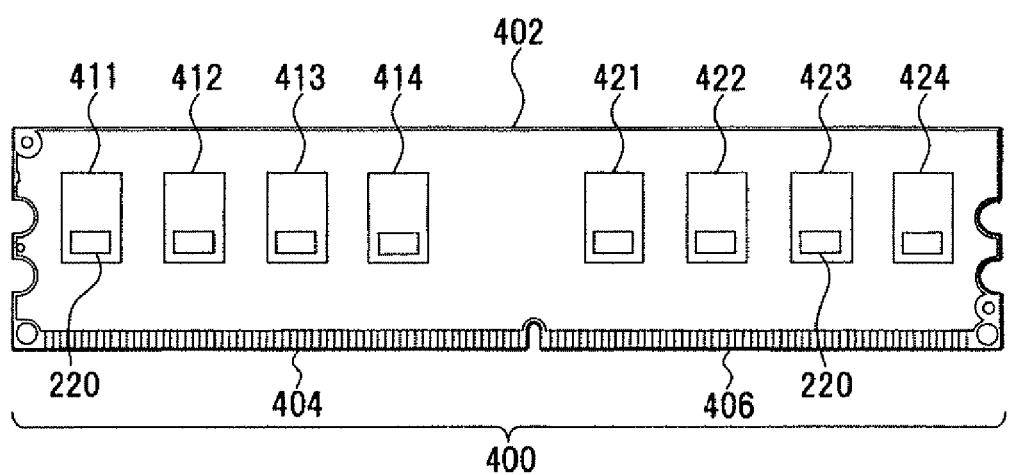
FIG. 9 is a view of an exemplary configuration of a memory card of a fourth embodiment.

A fourth embodiment of the present invention will be described with reference to FIG. 9. FIG. 9 depicts an exemplary configuration of a memory card of the fourth embodiment. In FIG. 9, the same components as described in FIG. 2 or 3 are denoted by the same reference numerals.

The memory card 400 is a specific embodiment of the above described memory module 100. The memory card 400 includes a circuit board 402 having connectors 404 and 406 that are inserted into a socket on a motherboard side to provide electrical connection. The connector 404 carries four memory chips 411, 412, 413 and 414, and the connector 406 carries four memory chips 421, 422, 423 and 424. Each of the memory chips 411 to 414 and 421 to 424 has the above mentioned memory matrixes 211 to 214 and the control register 220. Each memory chip may also have the SPD memory unit 222 juxtaposed with the control register 220.

As described above, this memory card 400 can be used separately as a memory card having a different specification and function, thus serving as a memory device having extremely high flexibility. The memory card 400 allows a change in specification and function and is able to operate in correspondence to a given service environment, thus enables optimization and improvement in compatibility of the memory.

Fifth Embodiment

Figure 10:
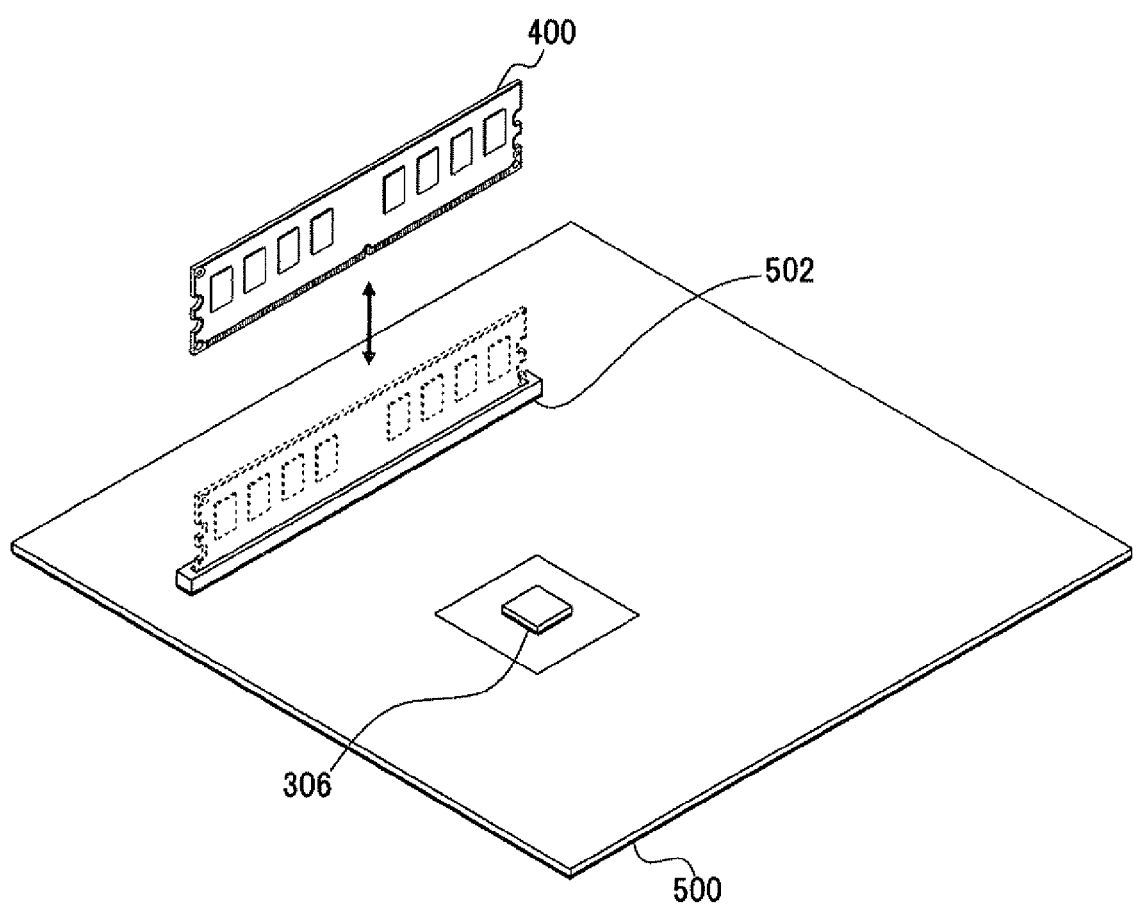
FIG. 10 is a view of an exemplary configuration of a circuit board of a fifth embodiment.

A fifth embodiment of the present invention will be described with reference to FIG. 10. FIG. 10 depicts an exemplary configuration of a circuit board of the fifth embodiment. In FIG. 10, the same components as described in FIG. 7 or 9 will be denoted by the same reference numerals.

The circuit board 500 includes a memory slot 502 in which the memory card 400 equipped with the above described memory module 100 is fitted, and a north bridge 306. The north bride 306 and the memory slot 502 are connected to each other via a bus to be able to exchange data with each other.

According to the circuit board 500, control data is written in on each of the control registers 220 incorporated in the memory card 400 to achieve highly flexible memory access.

Other Embodiments

Modifications, features, etc. of the above embodiments will be enumerated as follows.

(1) As described in the above embodiments, the memory module 100 assumes a function of a memory interface, thus maintaining high compatibility. Maintaining compatibility means, for example, that a module equipped with a memory chip can be used permanently because of its compatibility.

(2) The control register 220 of each of the memory chips 201 to 20N may be given a program-based determining function. In such a case, if timing of interfacing is different depending on the product generation of the memory chips, a separate control interface may be provided for identifying a memory chip.

(3) In the above embodiments, the PC 300 is described as electronic equipment that is an application example of the memory device. The present invention, however, may apply widely to a TV set with a PC function, server, telephone set, etc.

While the preferred embodiments of the present invention have been described, the description is not intended to limit the present invention. Various modifications and variants will be apparent to those skilled in the art based on the substance of the invention described in the appended claims or disclosed in the specification, and such modifications and variants obviously fall within the true scope of the invention.

According to the present invention, each memory chip has an internal memory part such as a control register, which stores control data on the memory chip. This is useful to enable the use of the memory device on a memory chip to memory-chip basis, allow the memory chips to operate in correspondence to an environment change such as a specification change, thus optimize the memory device and improve flexibility and compatibility of the memory.

What is claimed is:

1. A memory device including a plurality of memory chips, comprising:
   each memory chip that has
      a memory part, which stores control data concerning the memory chip,
      a plurality of banks, functions or operation of the plurality of banks being controlled based on the control data stored in the memory part, inside thereof,
      a fixed data memory part storing fixed data concerning the memory chip, and
      an input/output part connected to the memory part and the fixed data memory part,
   wherein the input/output part is allowed to exchange data with an external device through connection of a bus between the input/output part and the external device when the bus is connected to the input/output part, and
   the control data stored in the memory part is allowed to be written in and read out, the fixed data stored in the fixed data memory part is allowed to be transferred to the memory part via the input/output part to be written in the memory part, and the fixed data transferred from the fixed data memory part is allowed to be included in the control data.

2. The memory device of claim 1, wherein
the memory part is comprised of a control register.

3. The memory device of claim 1, wherein
the plurality of banks make up a single or a plurality of memory matrixes.

4. The memory device of claim 1, wherein
the memory part outputs the data to the bus via the input/output part if receiving a command signal.

5. The memory device of claim 1, wherein
the fixed data stored in the fixed data memory part is read out from the fixed data memory part to be outputted to the bus via the input/output part.

6. A control method for a memory device including a plurality of memory chips, the method comprising:
   writing in or reading out control data concerning each memory chip to or from a memory part storing the control data, the memory part being included in each of the memory chips;
   controlling functions or operation of a plurality of banks based on the control data, the plurality of banks being included in each of the memory chips; and
   exchanging data with an external device through connection of a bus between an input/output part and the external device when the bus is connected to the input/output part,
   wherein fixed data stored in a fixed data memory part which stores the fixed data concerning the memory chip is allowed to be transferred to the memory part via the input/output part to be written in the memory part, and the fixed data transferred from the fixed data memory part is allowed to be included in the control data.

7. A computer-readable recording medium storing a control program for a memory device executed by a computer, the control program driving the computer to execute
   writing in or reading out control data concerning a memory chip to or from a memory part of the memory chip, the control data including data that controls functions or operation of a plurality of banks, the memory part being included in each of a plurality of the memory chips; and
   exchanging data with an external device through connection of a bus between an input/output part and the external device when the bus is connected to the input/output part,
   wherein the control data includes fixed data concerning the memory chip, the fixed data being transferred from a fixed data memory part to the memory part via the input/output part to be written in the memory part.

8. A memory card including a plurality of memory chips, comprising:
   each memory chip that has
      a memory part, which stores control data concerning the memory chip,
      a plurality of banks, functions or operation of the plurality of banks being controlled based on the control data stored in the memory part, inside thereof,
      a fixed data memory part storing fixed data concerning the memory chip, and
      an input/output part connected to the memory part and the fixed data memory part,
   wherein the input/output part is allowed to exchange data with an external device through connection of a bus between the input/output part and the external device when the bus is connected to the input/output part, and
   the control data stored in the memory part is allowed to be written in or read out, the fixed data stored in the fixed data memory part is allowed to be transferred to the memory part via the input/output part to be written in the memory part, and the fixed data transferred from the fixed data memory part is allowed to be included in the control data.

9. The memory card of claim 8, wherein
the memory part is comprised of a control register.

10. The memory card of claim 8, wherein
the plurality of banks make up a single or a plurality of memory matrixes.

11. The memory card of claim 8, wherein
the memory part outputs the data to the bus via the input/output part if receiving a command signal.

12. The memory card of claim 8, wherein
the fixed data stored in the fixed data memory part is read out from the fixed data memory part to be outputted to the bus via the input/output part.

13. A circuit board provided with a memory device including a plurality of memory chips, comprising:
   each memory chip that has a memory part, which stores control data concerning the memory chip, a plurality of banks, functions or operation of the plurality of banks being controlled based on the control data stored in the memory part, inside thereof, a fixed data memory part storing fixed data concerning the memory chip, and an input/output part connected to the memory part and the fixed data memory part, wherein the input/output part is allowed to exchange data with an external device through connection of a bus between the input/output part and the external device when the bus is connected to the input/output part, and the control data stored in the memory part is allowed to be written in or read out, the fixed data stored in the fixed data memory part is allowed to be transferred to the memory part via the input/output part to be written in the memory part, and the fixed data transferred from the fixed data memory part is allowed to be included in the control data.

14. A circuit board comprising:

a memory card including a plurality of memory chips;

a slot into which the memory card is fitted;

a circuit mounted on the circuit board; and a bus to connect between the circuit and the slot, the memory chips including:

a memory part, which stores control data concerning the memory chip, a plurality of banks, functions or operation of the plurality of banks being controlled based on the control data stored in the memory part, inside thereof, a fixed data memory part storing fixed data concerning the memory chip, and an input/output part connected to the memory part, the fixed data memory part and the bus, wherein the input/output part is allowed to exchange data with the circuit through connection of the bus, and the control data stored in the memory part is allowed to be written in or read out, the fixed data stored in the fixed data memory part is allowed to be transferred to the memory part via the input/output part to be written in the memory part, and the fixed data transferred from the fixed data memory part is allowed to be included in the control data.

15. Electronic equipment using the memory device of claim 1.

16. Electronic equipment using the memory card of claim 8.

* * * * *